United States Patent
Wang et al.

(10) Patent No.: US 9,691,312 B2
(45) Date of Patent: Jun. 27, 2017

(54) SHIFT REGISTER UNIT, SHIFT REGISTER AND DISPLAY APPARATUS

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Zhiyong Wang, Beijing (CN); Yao Yu, Beijing (CN); Shuai Xu, Beijing (CN); Zhengxin Zhang, Beijing (CN); Yi Zheng, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 348 days.

(21) Appl. No.: 14/374,297

(22) PCT Filed: Dec. 5, 2013

(86) PCT No.: PCT/CN2013/088578
§ 371 (c)(1),
(2) Date: Jul. 24, 2014

(87) PCT Pub. No.: WO2015/027600
PCT Pub. Date: Mar. 5, 2015

(65) Prior Publication Data
US 2016/0275834 A1    Sep. 22, 2016

(30) Foreign Application Priority Data

Aug. 29, 2013    (CN) .......................... 2013 1 0384888

(51) Int. Cl.
G11C 19/00    (2006.01)
G09G 3/00    (2006.01)
G11C 19/28    (2006.01)

(52) U.S. Cl.
CPC ............... *G09G 3/00* (2013.01); *G11C 19/28* (2013.01); *G09G 2300/0426* (2013.01);
(Continued)

(58) Field of Classification Search
None
See application file for complete search history.

(56) References Cited

U.S. PATENT DOCUMENTS

| 9,269,455 B2 * | 2/2016 | Liu | ........................ G11C 19/28 |
| 2010/0109995 A1 * | 5/2010 | Fang | .................... G09G 3/3677 345/100 |

(Continued)

FOREIGN PATENT DOCUMENTS

| CN | 101644867 A | 2/2010 |
| CN | 102682699 A | 9/2012 |

(Continued)

OTHER PUBLICATIONS

International Preliminary Report on Patentability issued Mar. 1, 2016; PCT/CN2013/088578.
(Continued)

*Primary Examiner* — Tuan T Lam
(74) *Attorney, Agent, or Firm* — Ladas & Parry LLP

(57) ABSTRACT

A shift register unit, a shift register and a display apparatus are provided. The shift register unit includes a voltage-boosting module configured to output a first level signal when receiving a gate driving signal sent from the previous stage of shift register unit; a signal output module configured to output a gate driving signal under the control of a first clock signal based on the first level signal output by the
(Continued)

voltage-boosting module; a reset module configured to control the signal output module to reset under the control of a reset signal; and a pull-down module configured to pull down the output level of the signal output module under the control of a second clock signal. It is possible to reduce the power consumption of the integrated circuit and avoid the abnormal waveform issue due to the decay of the reset signal by employing the technical solutions of embodiments of the present disclosure.

9 Claims, 2 Drawing Sheets

(52) U.S. Cl.
CPC . *G09G 2310/0286* (2013.01); *G09G 2310/08* (2013.01); *G09G 2330/021* (2013.01)

(56) References Cited

U.S. PATENT DOCUMENTS

| | | | | |
|---|---|---|---|---|
| 2011/0193831 | A1* | 8/2011 | Kunimori | G11C 19/184 345/204 |
| 2012/0139599 | A1* | 6/2012 | Chen | G09G 3/3677 327/203 |
| 2012/0154361 | A1 | 6/2012 | Wu et al. | |
| 2013/0088265 | A1* | 4/2013 | Chen | H03K 5/153 327/108 |
| 2014/0072093 | A1 | 3/2014 | Shang et al. | |
| 2014/0098015 | A1* | 4/2014 | Wang | G09G 3/3677 345/100 |
| 2014/0192039 | A1* | 7/2014 | Wang | G11C 19/28 345/213 |
| 2015/0043703 | A1* | 2/2015 | Tan | G11C 19/28 377/68 |
| 2015/0213762 | A1* | 7/2015 | Xia | G09G 3/3266 345/215 |
| 2015/0318052 | A1* | 11/2015 | Li | G11C 19/28 377/64 |
| 2015/0339999 | A1* | 11/2015 | Zheng | G11C 19/28 345/92 |
| 2016/0266699 | A1* | 9/2016 | Zhao | G09G 3/36 |
| 2016/0268004 | A1* | 9/2016 | Li | G11C 19/28 |

FOREIGN PATENT DOCUMENTS

| | | |
|---|---|---|
| CN | 102708818 A | 10/2012 |
| CN | 102956213 A | 3/2013 |
| CN | 202838909 U | 3/2013 |
| CN | 202905121 U | 4/2013 |
| CN | 103151011 A | 6/2013 |
| KR | 1020050087983 A | 9/2005 |

OTHER PUBLICATIONS

International Search Report Appln. No. PCT/CN2013/088578; Dated May 15, 2014.
Extended European Search Report dated Mar. 10, 2017; Appln. 13872267.3-1804/3041000 PCT/CN2013088578.
First Chinese Office Action dated Mar. 30, 2017; Appln. No. 201310384888.9.

* cited by examiner

SHIFT REGISTER UNIT, SHIFT REGISTER AND DISPLAY APPARATUS

TECHNICAL FIELD OF THE DISCLOSURE

The present disclosure relates to the field of display technology, and particularly to a shift register unit, a shift register and a display apparatus.

BACKGROUND

Currently, a shift register can integrate a gate switch circuit onto an array substrate, and remove the circuit of the gate driving integrated circuit section. It is possible, by integrating the array substrate using the shift register and composing a display device using the array substrate, to save material and decrease processing steps while the screen size and product cost can be reduced.

The above shift register has multiple shift register units. Each shift register unit has input terminals such as a first clock signal input terminal, a second clock signal input terminal and a low voltage signal input terminal, and each shift register unit also has an input terminal (Input), an output terminal (Output) and a reset signal terminal (Reset). However, the output of each stage of shift register unit in the above shift register is as the reset signal of the previous stage of shift register unit, so that the abnormal waveform problem of the reset signal would arise with the cascade of the shift registers. In addition, since the first clock signal or the second clock signal keeps connection to the output terminal of the shift register unit during the high level period, it is not possible to reduce the power consumption of the integrated circuit.

SUMMARY

The technical problems to be solved by the present disclosure is to provide a shift register unit, a shift register and a display apparatus to reduce the power consumption of the integrated circuit and avoid the abnormal waveform issue due to the decay of the reset signal.

In order to solve the above technical problems, the technical solutions of embodiments of the present disclosure can be implemented as the followings.

There provides in an embodiment of the present disclosure a shift register unit, comprising:
  a voltage-boosting module configured to output a first level signal when receiving a gate driving signal sent from the previous stage of shift register unit or a start signal;
  a signal output module configured to output a gate driving signal under the control of a first clock signal based on the first level signal outputted by the voltage-boosting module;
  a reset module configured to control the signal output module to reset under the control of a reset signal; and
  a pull-down module configured to pull down the output level of the signal output module under the control of a second clock signal.

In the above embodiment, the shift register unit further comprises a charge-sharing switch configured to connect the output terminal of the current stage of shift register unit to the output terminal of the next stage of shift register unit to perform charge sharing under the control of the reset signal.

In the above embodiment, the voltage-boosting module comprises a first transistor M1 whose gate is connected to a signal input terminal Input, whose first electrode is connected with the first level signal, and whose second electrode is connected to a first capacitor C1; the reset module comprises a second transistor M2 whose gate is connected with the reset signal, whose first electrode is connected to the second electrode of the first transistor M1, and whose second electrode is connected with the second level signal; the signal output module comprises a third transistor M3, a sixth transistor M6 and the capacitor C1, a first electrode of the third transistor M3 is connected with the first clock signal, the gate of the third transistor M3 is connected to a second electrode of the sixth transistor, a second electrode of the third transistor M3 is connected to a shift register output terminal Output, the gate of the sixth transistor M6 is connected with the first clock signal, a first electrode of the sixth transistor M6 is connected to a first electrode of the first capacitor, and the second electrode of the sixth transistor M6 is connected to the gate of the third transistor M3; the pull-down module comprises a fourth transistor M4 whose gate is connected with the second clock signal CLKB, whose first electrode is connected to the shift register output terminal Output, and whose second electrode is connected with the second level signal; and the charge-sharing switch comprises a fifth transistor MS whose gate is connected with the reset signal, whose first electrode is connected to the output terminal of the current stage of shift register unit, and whose second electrode is connected to the output terminal of the next stage of shift register unit.

In the above embodiment, the first level signal is a high level voltage VGH, and the second level signal is a low level voltage VGL.

In the above embodiment, when the voltage-boosting module receives the gate driving signal from the previous stage of shift register unit or the initial signal, the first level signal is output to the signal output module;
  the output terminal receives the charges shared with the previous stage of shift register unit;
  the signal output module outputs the gate driving signal under the control of the first clock signal after receiving the first level signal;
  the charge-sharing switch shares the output gate driving signal with the output terminal of the next stage of shift register unit under the control of the reset signal;
  the reset module controls the signal output module to reset under the control of the reset signal, and the pull-down module pulls down the output level of the signal output module under the control of the second clock signal.

An embodiment of the present disclosure provides a shift register comprising multiple stages of cascaded shift register units according to any of the above solutions, wherein
  the signal input terminal of each stage of shift register unit other than the first stage is connected to the signal output terminal of the previous stage of shift register unit; and
  the reset module and the charge-sharing switch of each stage of shift register unit is connected with a reset signal, wherein the odd stages of shift register unit is connected with a first reset signal, and the even stages of shift register unit is connected with a second reset signal.

There provides in an embodiment of the present disclosure a display apparatus comprising the shift register in the above solution.

According to the shift register unit, the shift register and the display apparatus of embodiments of the present disclosure, the waveform of the reset signal is ensured to be normal by connecting the source of the second transistor directly to the reset signal. In addition, the sixth transistor controls the turning on of the third transistor. When the first clock signal is set at high level, the reset signal of the present row is received, and then the sixth transistor controls the third transistor to be turned off to cut off the connection between the first clock signal and the output terminal. Therefore, the time for connecting the first clock signal to the output terminal can be reduced, and the power consumption of the integrated circuit is decreased.

Further, embodiments of the present disclosure add a charge sharing switch between two shift register units to realize the charge sharing between the two shift register units, so as to reduce the power consumption of the driving circuit.

DETAILED DESCRIPTION

Figure 1:
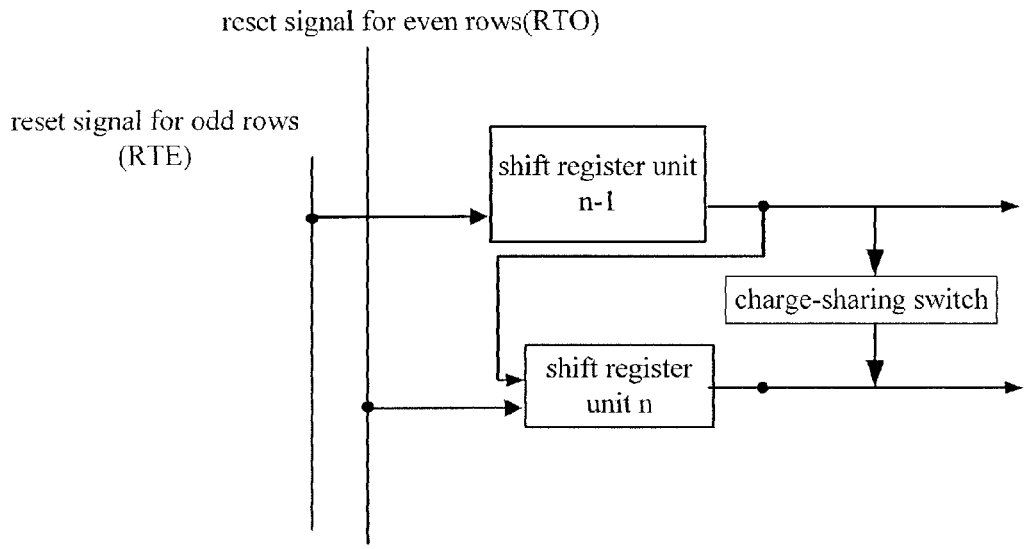
FIG. 1 is a first schematic structural diagram of the composition of a shift register according to an embodiment of the present disclosure.

In the following, the technical solutions in embodiments of the present disclosure will be clearly and completely described in connection with the drawings. The transistors adopted in all the embodiments of the present disclosure can be field effect transistors. Since the source and the drain of the field effect transistor adopted herein are symmetrical, there is no difference between its source and drain. In embodiments of the present disclosure, in order to distinguish the two electrodes other than the gate in the field effect transistor, a first electrode among them is referred to as the source, and a second electrode is referred to as the drain. In the configuration shown in the drawings, it provides that the upper terminal of the field effect transistor is the source, and the lower terminal is the drain.

As shown in FIG. 1, a shift register provided in an embodiment of the present disclosure comprises at least two shift register units, wherein a gate driving output terminal (Output) of the first shift register unit is connected to a gate driving input terminal (Input) of the next shift register unit, the reset signal of the shift register units located at odd rows is a first reset signal (RTE), the reset signal of the shift register units located at even rows is a second reset signal (RTO), and a charge-sharing switch is connected between the output terminals (Outputs) of two adjacent shift register units.

In the present embodiment, the charge-sharing switch is configured to connect the output terminal of the current stage of shift register unit to the output terminal of the next stage of shift register unit under the control of the reset signal. When the previous row of shift register unit receives the reset signal to be turned on, the gate driving output of the previous row of shift register unit is connected to the gate driving output of the next row of shift register unit to accomplish charge sharing.

Figure 2:
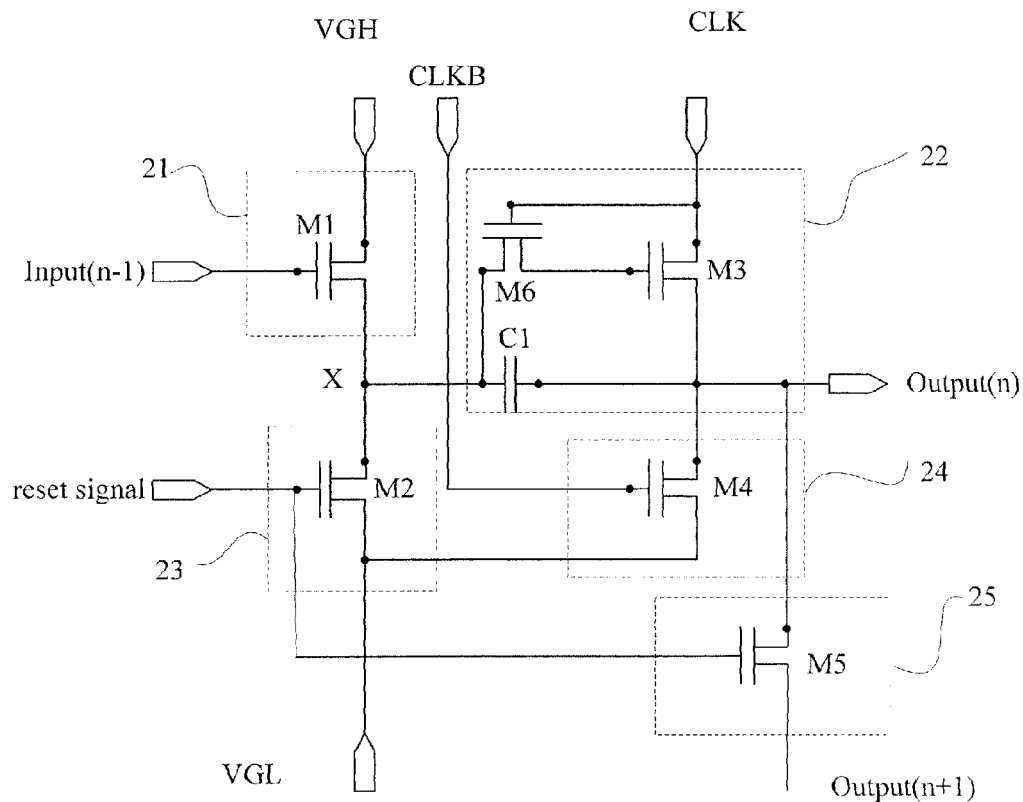
FIG. 2 is a second schematic structural diagram of a shift register unit according to an embodiment of the present disclosure.

As shown in FIG. 2, a shift register unit provided by an embodiment of the present disclosure comprises:

a voltage-boosting module 21 configured to output a first level signal to a signal output module 22 when receiving a gate driving signal sent from the previous stage of shift register unit or an initial signal;

the signal output module 22 configured to output a gate driving signal under the control of a first clock signal according to the first level signal;

a reset module 23 configured to control the signal output module 22 to reset under the control of a reset signal; and a pull-down module 24 configured to pull down the output level of the signal output module 22 under the control of a second clock signal.

The shift register unit further comprises a charge-sharing switch 25 configured to connect the output terminal of the current stage of shift register unit to the output terminal of the next stage of shift register unit to perform charge sharing under the control of the reset signal.

Another embodiment of the present disclosure also provides a driving method based on the above shift register unit, comprising:

inputting a high level signal to the signal output module by the voltage-boosting module of the shift register unit;

keeping the high level signal inputted by the voltage-boosting module and outputting a driving signal when the received first clock signal is at the high level by the signal output module of the shift register unit;

resetting the signal output module when the reset module of the shift register unit receives the reset signal for the current row, and connecting the output terminal of the current stage of shift register unit to the output terminal of the next stage of shift register unit to perform charge sharing after the charge-sharing switch receives the reset signal; and pulling down the output terminal to a low level after the pull-down module receives the second clock signal.

An embodiment of the present disclosure takes the shift register unit shown in FIG. 2 as the current shift register unit, wherein M1 is a first transistor, M2 is a second transistor, M3 is a third transistor, M4 is a fourth transistor, M5 is a fifth transistor, M6 is a sixth transistor, and C1 is a first capacitor. The connection between respective elements of the shift register unit will be described in detail in the following.

The voltage-boosting module comprises the first transistor M1, the reset module comprises the second transistor M2, the signal output module comprises the third transistor M3, the sixth transistor M6 and the capacitor C1, the pull-down module comprises the fourth transistor M4, and the charge-sharing switch comprises the fifth transistor M5.

In the present embodiment, the gate of the first transistor M1 is connected to the input terminal (Input), the first electrode thereof is connected with the first level signal VGH, and the second electrode thereof is connected to the first capacitor C1.

The gate of the second transistor M2 is connected with the reset signal, the first electrode thereof is connected to the second electrode of the first transistor M1 and the second electrode thereof is connected with the second level signal VGL.

The first electrode of the third transistor M3 is connected with the first clock signal CLK, the gate thereof is connected to the second electrode of the sixth transistor M6, the second electrode thereof is connected to a shift register output terminal Output.

The gate of the sixth transistor M6 is connected with the first clock signal CLK, the first electrode thereof is connected to a first electrode of the first capacitor, and the second electrode thereof is connected to the gate of the third transistor M3.

The gate of the fourth transistor M4 is connected with the second clock signal CLKB, the first electrode thereof is connected to the shift register output terminal Output, and the second electrode thereof is connected with the second level signal VGL.

The gate of the fifth transistor M5 is connected with the reset signal, the first electrode is connected to the output terminal Output(n) of the current stage of shift register unit, and the second electrode thereof is connected to the output terminal Output(n+1) of the next stage of shift register unit.

In the present embodiment, the fifth transistor M5 is the charge-sharing switch configured to connect the gate driving output terminal of the previous row of shift register unit to the gate driving output terminal of the next row of shift register unit to perform charge sharing when the previous row of shift register unit receives the reset signal and is turned on. The gate of the fifth transistor M5 is connected with the reset signal of the previous row of shift register unit, the first electrode of the fifth transistor M5 is connected to the output terminal of the previous row of shift register unit, and the second electrode of the fifth transistor M5 is connected to the output terminal of the next row of shift register unit.

Figure 3:
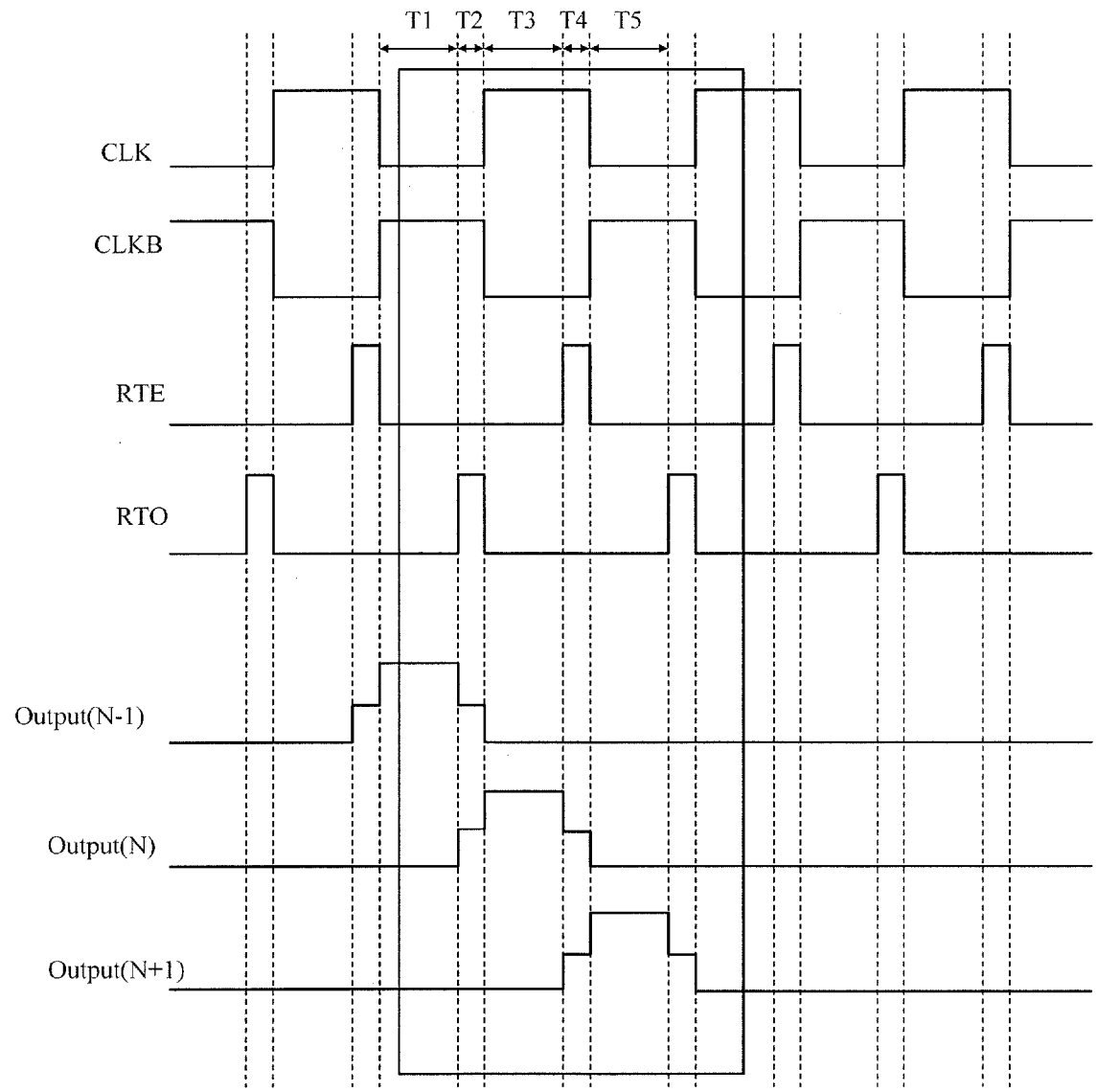
FIG. 3 is an operation timing diagram of a shift register according to an embodiment of the present disclosure.

FIG. 3 is a timing diagram corresponding to the shift register circuit, wherein N−1 represents an even row, N represents an odd row, CLK is the first clock signal, and CLKB is the second clock signal.

Specifically, in stage T1, the output terminal Output in the (N−1)$^{th}$ row of shift register unit is at the high level and its output is taken as the input signal of the N$^{th}$ row of shift register unit, and the first transistor M1 connected to the input terminal of the N$^{th}$ row of shift register unit is turned on. At this time, the first level signal is connected to the capacitor C1 to charge the capacitor C1, and the voltage of point (Point) X is boosted. Since the first clock signal CLK is at the low level, the transistors M3 and M6 are both at the cutoff state, and the first clock signal CLK has not been connected to the gate line output terminal of the N$^{th}$ row of shift register unit.

In stage T2, the second reset signal RTO is set at high level, the second transistor M2 in the (N−1)$^{th}$ row of shift register unit is turned on, the capacitor C1 in the (N−1)$^{th}$ row of shift register unit is connected with the second level signal VGL, the voltage at point X is pulled down, the voltage at the first electrode of the sixth transistor M6 is pulled down so that the third transistor M3 is turned off, and the gate line output terminal of the. N−1$^{th}$ row of shift register unit is disconnected with the first clock signal CLK. At the same time, the fifth transistor M5 is turned on, the gate line output terminal of the (N−1)$^{th}$ row of shift register unit is connected to the gate line output terminal of the N$^{th}$ row of shift register unit to accomplish charge sharing, the gate line output terminal of the N$^{th}$ row of shift register unit now is the shared voltage, the gate line output terminal of the (N−1)$^{th}$ row of shift register unit is at the high level, and the high level and the low level are averaged by connecting the gate line output terminals of the two rows to reach a median potential and form the effect of charge sharing. The first transistor M1 in the N$^{th}$ row of shift register unit would be turned off, and the capacitor C1 continues to keep the high level at point X to turn on the third transistor M3 at stage T3.

In stage T3, the second reset signal RTO is set at low level, the fifth transistor M5 between the gate line output terminal of the (N−1)$^{th}$ row of shift register unit and the gate line output terminal of the N$^{th}$ row of shift register unit is turned off, and the gate line output terminals of the two rows are disconnected. The first clock signal CLK is set at high level, the sixth transistor M6 of the N$^{th}$ row of shift register unit is turned on such as to turn on the third transistor M3, the first clock signal CLK is connected to the gate line output terminal of the N$^{th}$ row of shift register unit, and the N$^{th}$ row of shift register unit outputs a signal. At this time, the input terminal in the (N+1)$^{th}$ row of shift register unit receives the output signal of the N$^{th}$ row of shift register unit, and the first transistor M1 is turned on to connect the first level signal VGH with the capacitor C1 of the (N+1)$^{th}$ row of shift register unit to charge the capacitor C1, such that the voltage at point X is boosted.

In stage T4, the first reset signal RTE is set at high level, the second transistor M2 in the N$^{th}$ row of shift register unit is turned on, the capacitor C1 is connected to the second level signal VGL, the voltage at point X is pulled down, the third transistor M3 is turned off, and the gate line output terminal of the N$^{th}$ row of shift register unit is disconnected with the first clock signal CLK. At the same time, the fifth transistor M5 is turned on to connect the gate line output terminal of the N$^{th}$ row of shift register unit with the gate line output terminal of the (N+1)$^{th}$ row of shift register unit to accomplish one procedure of charge sharing, and the gate line output terminals of the N$^{th}$ row and the (N+1)$^{th}$ row are averaged to a median potential. After that, each time RTE is set at high level, the second transistor M2 is turned on to pull the voltage at point X down to the second level signal VGL, which, in cooperation with the fourth transistor M4 controlled by the second clock signal CLKB, ensures that the voltage at the gate line output terminal remains at the second level signal VGL, and suppresses the generation of ripples and noise. The first transistor M1 in the (N+1)$^{th}$ row of shift register unit would be turned off, and the capacitor C1 continues to keep the high level at point X to turn on the third transistor M3 in stage T5.

In stage T5, the first reset signal RTE is set at low level, the fifth transistor M5 of the N$^{th}$ row of shift register unit is turned off, and the gate line output terminals of the N$^{th}$ row and the (N+1)$^{th}$ row are disconnected. The second clock signal CLKB is set at high level, the fourth transistor M4 in the N$^{th}$ row of shift register unit is turned on, the gate is connected with the second level signal VGL, and the potential is pulled down to the second level signal VGL from the median potential. For other gate line output terminals, since the potentials are all the second level signal VGL, no influence arises. The first clock signal CLK is set at high level, and the sixth transistor M6 of the (N+1)$^{th}$ row of shift register unit is turned on so that the third transistor M3 is turned on, the first clock signal CLK is connected to the gate line output terminal of the (N+1)$^{th}$ row of shift register unit, and the (N+1)$^{th}$ row of shift register unit outputs a signal.

The above implementations are only for illustrating the present disclosure and in no way limit the scope of the present disclosure. It will be obvious that those skilled in the art may make various modifications or variations without departing from the spirit and scope of the present disclosure. Such modifications and variations shall fall within the scope of the present disclosure which is defined by the following claims.

What is claimed is:
1. A shift register unit, comprising:
  a voltage-boosting module configured to output a first level signal when receiving a gate driving signal sent from the previous stage of shift register unit or a start signal;

a signal output module configured to output a gate driving signal under the control of a first clock signal based on the first level signal outputted by the voltage-boosting module;
a reset module configured to control the signal output module to reset under the control of a reset signal;
a pull-down module configured to pull down the output level of the signal output module under the control of a second clock signal; and
a charge-sharing switch configured to connect the output terminal of the current stage of shift register unit to the output terminal of the next stage of shift register unit to perform charge sharing under the control of the reset signal.

2. The shift register unit according to claim 1, wherein
the voltage-boosting module comprises a first transistor whose gate is connected to a signal input terminal, whose first electrode is connected with the first level signal, and whose second electrode is connected to a first capacitor;
the reset module comprises a second transistor whose gate is connected with the reset signal, whose first electrode is connected to the second electrode of the first transistor, and whose second electrode is connected with the second level signal;
the signal output module comprises a third transistor, a sixth transistor and the capacitor, a first electrode of the third transistor is connected with the first clock signal, the gate of the third transistor is connected to a second electrode of the sixth transistor, a second electrode of the third transistor is connected to a shift register output terminal, the gate of the sixth transistor is connected with the first clock signal, a first electrode of the sixth transistor is connected to a first electrode of the first capacitor, and the second electrode of the sixth transistor is connected to the gate of the third transistor;
the pull-down module comprises a fourth transistor whose gate is connected with the second clock signal, whose first electrode is connected to the shift register output terminal, and whose second electrode is connected with the second level signal; and
the charge-sharing switch comprises a fifth transistor whose gate is connected with the reset signal, whose first electrode is connected to the output terminal of the current stage of shift register unit, and whose second electrode is connected to the output terminal of the next stage of shift register unit.

3. The shift register unit according to claim 2, wherein
the first level signal is a high level voltage, and the second level signal is a low level voltage.

4. The shift register unit according to claim 3, wherein
when the voltage-boosting module receives the gate driving signal from the previous stage of shift register unit or the start signal, the first level signal is output to the signal output module;
the output terminal receives the charges shared with the previous stage of shift register unit;
the signal output module outputs the gate driving signal under the control of the first clock signal after receiving the first level signal;
the charge-sharing switch shares the output gate driving signal with the output terminal of the next stage of shift register unit under the control of the reset signal;
the reset module controls the signal output module to reset under the control of the reset signal, and the pull-down module pulls down the output level of the signal output module under the control of the second clock signal.

5. A shift register comprising multiple stages of cascaded shift register units according to claim 1, wherein
the signal input terminal of each stage of shift register unit other than the first stage is connected to the signal output terminal of the previous stage of shift register unit; and
the reset module and the charge-sharing switch of each stage of shift register unit are connected with a reset signal, wherein the odd stages of shift register unit is connected with a first reset signal, and the even stages of shift register unit is connected with a second reset signal.

6. A display apparatus comprising the shift register according to claim 5.

7. The shift register according to claim 5, wherein
the voltage-boosting module comprises a first transistor whose gate is connected to a signal input terminal, whose first electrode is connected with the first level signal, and whose second electrode is connected to a first capacitor;
the reset module comprises a second transistor whose gate is connected with the reset signal, whose first electrode is connected to the second electrode of the first transistor, and whose second electrode is connected with the second level signal;
the signal output module comprises a third transistor, a sixth transistor and the capacitor, a first electrode of the third transistor is connected with the first clock signal, the gate of the third transistor is connected to a second electrode of the sixth transistor, a second electrode of the third transistor is connected to a shift register output terminal, the gate of the sixth transistor is connected with the first clock signal, a first electrode of the sixth transistor is connected to a first electrode of the first capacitor, and the second electrode of the sixth transistor is connected to the gate of the third transistor;
the pull-down module comprises a fourth transistor whose gate is connected with the second clock signal, whose first electrode is connected to the shift register output terminal, and whose second electrode is connected with the second level signal; and
the charge-sharing switch comprises a fifth transistor whose gate is connected with the reset signal, whose first electrode is connected to the output terminal of the current stage of shift register unit, and whose second electrode is connected to the output terminal of the next stage of shift register unit.

8. The shift register unit according to claim 7, wherein
the first level signal is a high level voltage, and the second level signal is a low level voltage.

9. The shift register unit according to claim 8, wherein
when the voltage-boosting module receives the gate driving signal from the previous stage of shift register unit or the start signal, the first level signal is output to the signal output module;
the output terminal receives the charges shared with the previous stage of shift register unit;
the signal output module outputs the gate driving signal under the control of the first clock signal after receiving the first level signal;
the charge-sharing switch shares the output gate driving signal with the output terminal of the next stage of shift register unit under the control of the reset signal;
the reset module controls the signal output module to reset under the control of the reset signal, and the pull-down module pulls down the output level of the signal output module under the control of the second clock signal.

* * * * *